United States Patent
Ritz et al.

(10) Patent No.: US 7,550,208 B2
(45) Date of Patent: Jun. 23, 2009

(54) TRANSPARENT TITANIUM OXIDE-ALUMINUM AND/OR ALUMINUM OXIDE COATING WITH RUTILE STRUCTURE

(75) Inventors: Arnd Ritz, Heinsberg (DE); Michael Vergöhl, Cremling Destedt (DE); Berno Hunsche, Braunschweig (DE)

(73) Assignee: Koninklijke Philips Electronics N.V., Eindhoven (NL)

( * ) Notice: Subject to any disclaimer, the term of this patent is extended or adjusted under 35 U.S.C. 154(b) by 23 days.

(21) Appl. No.: 10/543,284

(22) PCT Filed: Jan. 21, 2004

(86) PCT No.: PCT/IB2004/000129

§ 371 (c)(1),
(2), (4) Date: Jul. 3, 2006

(87) PCT Pub. No.: WO2004/067791

PCT Pub. Date: Aug. 12, 2004

(65) Prior Publication Data

US 2006/0255739 A1 Nov. 16, 2006

(30) Foreign Application Priority Data

Jan. 28, 2003 (EP) .................................. 03100170

(51) Int. Cl.
*B32B 9/00* (2006.01)
*B32B 15/00* (2006.01)

(52) U.S. Cl. ....................... 428/697; 428/432; 428/702; 313/113

(58) Field of Classification Search ................ 428/35.7, 428/428, 432, 446, 697, 702; 359/265, 267, 359/269, 274, 507; 313/113
See application file for complete search history.

(56) References Cited

U.S. PATENT DOCUMENTS

| | | | |
|---|---|---|---|
| 3,995,192 A | | 11/1976 | Hammer |
| 5,081,396 A | * | 1/1992 | Schneider et al. ............ 313/630 |
| 5,113,109 A | * | 5/1992 | Kawakatsu et al. ......... 313/112 |
| 5,853,830 A | * | 12/1998 | McCaulley et al. ........ 428/35.7 |
| 5,902,569 A | * | 5/1999 | Oshima et al. ................. 424/59 |
| 6,071,623 A | * | 6/2000 | Sugawara et al. ............ 428/428 |
| 6,816,297 B1 | * | 11/2004 | Tonar et al. .................. 359/265 |
| 2001/0031365 A1 | * | 10/2001 | Anderson et al. ............ 428/432 |
| 2005/0175796 A1 | * | 8/2005 | Nakamura et al. ......... 428/32.8 |

FOREIGN PATENT DOCUMENTS

| | | |
|---|---|---|
| DE | 4037179 C2 | 5/1991 |
| DE | 4031489 A | 4/1992 |
| DE | 4031489 C2 | 4/1992 |
| EP | 0465309 A | 1/1992 |
| JP | 03135502 A | 6/1991 |
| JP | 08051103 | 2/1996 |
| JP | 08051103 A | 2/1996 |
| WO | 8505292 A | 12/1985 |
| WO | 9708357 A | 3/1997 |
| WO | 2004026782 A1 | 4/2004 |
| WO | 2004067464 A1 | 8/2004 |

* cited by examiner

*Primary Examiner*—Timothy M Speer
*Assistant Examiner*—Lauren Robinson

(57) ABSTRACT

Transparent, temperature-stable coatings based on titanium oxide with a high refractive index and improved thermal and mechanical properties comprise titanium oxide with at least one additive from the group comprising aluminum and/or aluminum oxide, whereby the proportion of Al atoms in the coating, with reference to the total number of metal atoms in the coating is in the range from 2 to 4%.

9 Claims, 1 Drawing Sheet

Figure 1:
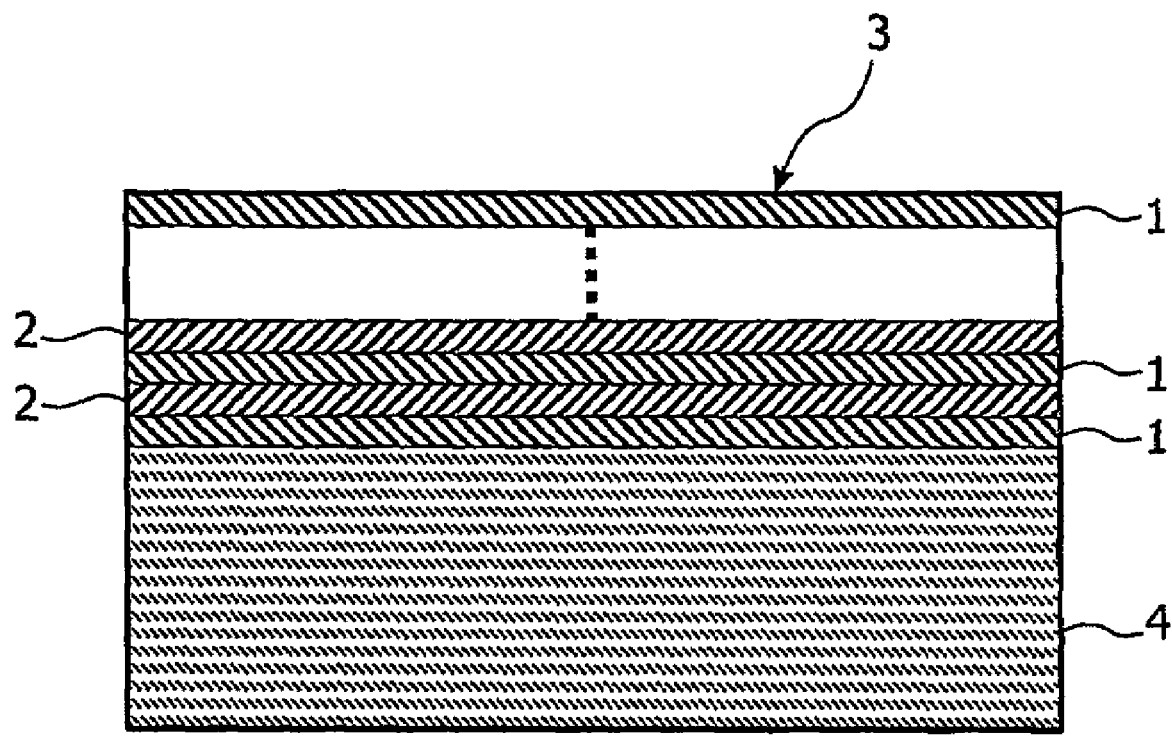

TRANSPARENT TITANIUM OXIDE-ALUMINUM AND/OR ALUMINUM OXIDE COATING WITH RUTILE STRUCTURE

The invention relates in general to a transparent titanium oxide coating or coatings with at least one additive from the group comprising aluminum and/or aluminum oxide, whereby the coating has a rutile structure.

The invention relates in particular to transparent coatings in the form of thin coatings or films based on the transparent titanium oxide coating with a rutile structure, whereby the titanium oxide coating contains aluminum or aluminum oxide.

It is known to apply a coating to the external or internal surface of a lamp, such as a projection lamp, in order to selectively reflect chosen light components over a specified wavelength range from the optical spectrum. In doing so, depending on the working principle of the coating and the geometry of the lamp bulb, the entire lamp bulb can be covered. This is, for example, the case with commercially available halogen lamps. In such a halogen lamp a filament or a wire is arranged in the center of a glass bulb and an optical interference film or an optical interference coating is applied to the external surface of the bulb. The optical interference coating is permeable to rays in the visible range, while infrared rays are reflected. Infrared rays contained in the light emitted from the filament are reflected by the optical interference coating back to the filament causing the filament to heat up. This leads to a decrease in the proportion of infrared rays in the emitted light and to an increase in the luminous efficiency.

As an alternative to the complete coating of the light bulb, it is also possible for only a certain proportion of the lamp surface to be coated. This is, for example, the case with bowl reflector lamps and is in particular used in high performance lamps. High intensity discharge (HID) and in particular ultra-high performance (UHP) lamps are preferred for projection purposes, inter alia, because of their optical characteristics. For these applications, the most concentrated possible light source is required, so that the arc that forms between the electrode tips does not exceed a length of approximately 0.5-2.5 mm. Furthermore, the highest possible light intensity is desired.

These characteristics can best be achieved with UHP lamps. These lamps comprise the mercury burner in a thick-walled quartz glass bulb, which in turn is cemented into an ellipsoid-shaped glass body so that the plasma mid-point of the mercury burner is positioned congruently with a focal point of the ellipsoid. The internal surface of the ellipsoid has a selective dielectric thin mirror-coating.

Because of the great flexibility in the spectral effect, multi-layer interference filters are frequently used for optical coatings. Such multi-layer interference filters frequently comprise stacks of at least two different dielectric materials with differing refractive indexes. The transmission and reflection areas of these filters are determined by the coating thicknesses of the individual coatings of high refractive index and low refractive index materials applied. Such filters can comprise an individual coating, as in a very simple mirror-coating, or several hundred coatings, as in a multiplexer in optical communications.

In the design of such filter stacks, the difference in refractive index of the materials used is of particular importance. In general, the greater this difference in refractive index is, the easier it is to achieve a specified spectral target function. For example, where the difference in refractive index is high the number of coatings in the design and the total thickness are lower which has a positive effect on production costs. Apart from these optical aspects, thermomechanical properties such as phase transformations in the application temperature range and the thermal coefficient of expansion of the material compared with the substrate are also of major significance to the producibility and usability of products.

For optical coatings on lamps, in particular for lamps with quartz bulbs, because of the almost perfect matching of the thermal coefficients of expansion to the wall material of the lamp, and because of the low refractive index for the low refractive index coatings, usually $SiO_2$ is used. For the high refractive index coatings, various materials can be used, such as $Ta_2O_5$, $Si_3N_4$ and $Nb_2O_5$. A particularly favorable material is $TiO_2$, which of the materials mentioned has the highest refractive index. $TiO_2$ also has, inter alia, a low temperature modification, anatase, which is stable at up to around 650° C., and a high temperature modification, rutile, which is stable in the limiting temperature range. Here, rutile has the higher refractive index.

For all coating methods it is the production conditions and the subsequent treatment that determine in which modification and with which refractive index the $TiO_2$ is present. In current coating methods, $TiO_2$ is present following deposition as anatase, and therefore as a material with a low refractive index. The transition to the higher refractive index rutile phase can be achieved by tempering at above the transition temperature, either by a separate process step during manufacture or simply by the operation of the lamp, if the operating temperature is sufficiently high, for example with high-performance HID burners.

From JP 08051103, a coating for a halogen lamp is known which comprises $TiO_2$—$Al_2O_3$ and is applied wet-chemically and then fired. Such coatings have a mechanical instability and may crack. In particular because of the large coating thicknesses achieved with the wet-chemical methods.

DE 40 37 179 A1 discloses that the addition of at least one metallic additive from the group comprising Sb, Si and Ta represents a possibility for controlling the phase transition from amorphous or anatasic $TiO_2$ to rutilic $TiO_2$ under the effect of high temperatures. For this, these metallic additives are used in a metal atom ratio M/Ti of 0.1 to 30%.

The phase transformation, however, results in a number of problems. Firstly, because of the transformation temperature that is necessary it is only possible to work on temperature stable substrates. Coatings of substrates which do not allow thermal treatment at these temperatures cannot therefore be achieved in the manner described. In addition, the phase transition of the $TiO_2$ from anatase to rutile is associated with changes in the grid characteristics, so that the density of the material increases by around 10%. Accordingly, the coatings must shrink geometrically which leads to stresses in the coating. In particular, with thicker coating stacks (above 1 μm total thickness) these cause cracks in the filter which may lead to the destruction of the filter within the lifetime of the lamps.

A phase transformation or change in the material properties can lead to a failure of the respective component, for example through a change in the refractive index and/or the coating thickness.

The object of the present invention was to make high refractive index titanium oxide coatings with a high rutile content with an improved temperature stability usable without a high temperature treatment with the associated disadvantages being necessary.

It has now been found that high refractive index titanium oxide coatings with a rutile-like short-range order structure are obtained if a small quantity of aluminum or aluminum oxide is incorporated in the coatings. The refractive index preferably corresponds to a mixture of pure rutile ($TiO_2$) and aluminum oxide ($Al_2O_3$).

The object of the invention is in a first embodiment a transparent, temperature-stable coating, containing titanium oxide with at least one additive from the group comprising aluminum and/or aluminum oxide, wherein the proportion of Al atoms in the coating with a rutile structure, in relation to the total metal atoms in the coating (1), is in the range of 2 to 40%.

The coating according to the invention is preferably amorphous and has a rutile-like short-range order structure, whereby the coating preferably does not have an anatase structure.

Coating(s) according to the invention such as this can be used for coating lighting media, such as lamps, that are suitable for lighting purposes, in particular in motor vehicles.

The transparent, in particular optically transparent, coating according to the invention includes titanium oxide, which contains an aluminum and/or aluminum oxide additive. This Al additive is used in specific quantities, in relation to the total number of metal atoms (Me=metal atoms) in the transparent coating, with the following atomic ratio applying:

$$0.02 \leq Al/Me \leq 0.40$$

where Me denotes the total number of metal atoms in the transparent coating. Transparent coatings that are preferred according to the invention have no metal atoms other than Al and Ti, so that the following atomic relation applies:

$$0.02 \leq Al/(Al+Ti) \leq 0.40$$

where the element symbols denote the number of the respective metal atoms.

Further preferred transparent refractive coatings according to the invention contain aluminum and titanium in oxide form, preferably as $Al_2O_3$ or $TiO_2$. Accordingly, so are optical coatings which comprise titanium oxide and aluminum oxide, with a proportion of Al atoms, in relation to the total number of metal atoms in the coating, of 2 to 40%, in particular 10 to 30%, preferably 15 to 20%.

The statements in the following paragraphs each relate exclusively to the high refractive index coatings of the interference stack. In the interference stack, the ratio of high to low refractive index material is dependent upon the filter design. According to the invention, however, filters can also be used that contain more than 2 coating materials, for example a minimum of 2 different high refractive index materials.

The rutile proportion of the optical coating according to the invention should in particular be at least 75% by weight, preferably >80% by weight, more preferably >85% by weight, even more preferably >90% by weight and most preferred 95%-100% by weight, in relation to the total proportion by weight of the titanium dioxide components of this coating.

The proportion of titanium atoms in the coating, in relation to the number of metal atoms in the coating, is 60 to 98%, in particular 70 to 90%, and preferably 80 to 85%.

Titanium oxide, also referred to as $TiO_2$ in the description, can within the context of this invention also denote $TiO_x$, in which x=1.9 to 2.1.

Aluminum oxide, also referred to as $Al_2O_3$ in the description, can within the context of this invention also denote $Al_2O_x$, in which x=2.9 to 3.1.

The proportion of Al atoms, in relation to the total number of metal atoms in the coating can be in the range from 2 to 40%, in particular 5 to 35%, preferably 10 to 30%, further 15 to 20%.

Most preferable is a proportion of Al atoms in the coating, in relation to the total number of metal atoms in the coating, of 10 to 20% and a proportion of Ti atoms in the coatings, in relation to the total number of metal atoms in the coating, of 80 to 90%.

The aluminum proportion and the titanium proportion of the coating according to the invention are selected so that the respective proportions make up a maximum of 100% by weight, in relation to the total weight of this coating.

The temperature-stable, transparent coating with rutile structure, containing titanium oxide with at least one additive from the group comprising aluminum and/or aluminum oxide, can be deposited while achieving the rutile structure by chemical vapor deposition, in particular sputtering, at a deposition temperature on the substrate of 20 to 300° C. from at least one target, comprising titanium and/or titanium oxide, with at least one metallic alloy target comprising titanium and aluminum, on the substrate surface to be coated at a definable oxygen partial pressure p. Deposition from at least one metallic titanium and one aluminum target is also possible.

Working generally takes place in an argon-oxygen atmosphere.

In this way, the rutile phase or the rutile structure can be created at a considerably lower temperature than with known methods. This also has the advantage that substrates which should not be heated to above 150° C. can now also be coated with optically valuable rutile. As already described, rutile has a very high refractive index.

The object of the invention described here is to make the rutile usable without the need for a high temperature treatment whilst avoiding the stability problems described. On top of this, the invention aims to produce coatings directly when coating in the rutile structure and with a high refractive index.

The placing or the application of the coatings according to the invention on or in bodies such as beam-forming devices, beam splitting devices, optical fiber components, lamps, glass, in particular heat protection glass, plastics, gas sensors, transparent interference filters, transparent filter systems, in particular heating lamp reflectors, cooling lamp reflectors, laser mirrors, anti-reflection systems, bandpass filters, edge filters, low-e glass and or bodies for electrical applications, such as electrical components, diffusion barriers or capacitor elements or lamps or components in optical information technology open up the possibility of using to effect the very high refractive index of rutile with consequent accompanying effective and cost-saving designs. This advantage is also available for products or substrates that do not allow any thermal treatment at above 150° C. Furthermore, when the material demonstrated here is used on lamps with high operating temperatures the phase transition from anatase to rutile and the associated problems for the lamp life do not occur.

Further applications can be beam-forming or beam-splitting devices on optical fibers or micro-optical components, for example for selection of certain wavelength ranges or for splitting of signals on various signal paths.

The coatings according to the invention are characterized by a high refractive index which must not be increased by tempering.

Transparent oxidic coatings according to the invention have, at a coating thickness of 400 nm and a wavelength of λ=550, a refractive index of n=2.3 to n=2.68, preferably n=2.4 to n=2.65 and more preferably n=2.45 to n=2.60. It has become apparent that a higher refractive index is preferable to a lower refractive index, i.e. the higher the refractive index, the better the optical properties.

Measurements are, unless otherwise specified, taken at ambient temperature of 23° C.

Transparent oxidic coatings according to the invention following a thermal treatment in the oven at 950° C. for 15 hours remain transparent and at a wavelength of λ=550 nm have a refractive index of n=2.3 to n=2.68, preferably n=2.40 to n=2.45 and more preferably n=2.45 to n=2.60.

The dispersion index, denoted in the following also by "iHaze", of the oxidic coating according to the invention has, following tempering in an oven at 900° C. and after 15 hours, an iHaze value for a coating thickness of 400 nm of $\geqq 0$ nm to 80 nm, preferably an iHaze value of 20 to 70 nm, more preferably an iHaze value of 30 nm to 60 nm and most preferably an iHaze value of 40 nm to 50 nm. An optimal coating has no dispersion and thus an iHaze$\geqq$0 nm. Most preferable, therefore, are iHaze values of $\geqq$0 nm. Further suitable iHaze values are $\geqq$1 nm, $\geqq$10 nm and $\geqq$15 nm. It must be stressed that the highest possible iHaze value of 0 nm to 1 nm is most preferred.

TiAlOx: after tempering in an oven at 900° C. and 15 hours

| Atomic ratio | Scatter |
| --- | --- |
| Ti/(Ti + Al) = 0.75 | iHaze = 33 nm |
| Ti/(Ti + Al) = 0.81 | iHaze = 22 nm |
| Ti/(Ti + Al) = 0.90 | iHaze = 34 nm |
| Ti/(Ti + Al) = 0.97 | iHaze = 45 nm |

The transparent coating according to the invention is preferably not applied on its own but in combination with other coatings to the substrates, in particular transparent substrates. In this way, transparent interference coatings are obtained. Such transparent interference coatings consist of at least two refractive or other coatings that are in contact, turned towards each other and superposed or opposing each other, and each have differing refractive indexes.

A transparent interference coating that is preferred according to the invention for the reflection of light within a wavelength range of the transparent spectrum of 250 to 5,000 nm, preferably 380 to 3,000 nm, more preferably 350 to 2,500 nm, even more preferably 400 to 2,000 nm, and in particular 420 to 1,500 nm, is designed such that the interference coating has at least one first coating(s) and second coating(s) according to the invention with a refractive index that is lower than that of the first coating(s), which are arranged on a substrate, preferably transparent substrate, in alternation. Further suitable reflection ranges are 680 to 2,600 nm, 800 to 2,500 nm, 820 to 2,450 nm, and 850 to 2400 nm, with particular preference for the ranges from 1,000 to 1,900 and 1,050 to 1,800 nm.

The second coating(s) can with reference to a wavelength of λ=550 nm, have a refractive index of n=1.32 to n=2.0, preferably n=1.35 to n=1.80, and most preferred n=1.44 to n=1.75. Further suitable values for n are 1.36; 1.42; 1.46; 1.48 and 1.50. By way of example, for an SiO$_2$ coating the refractive index can be n=1.45.

A further object of the present invention is therefore a transparent interference coating for reflection of light within a specified wavelength range of the transparent spectrum, whereby the coating has first coatings, and second coatings with a refractive index that is lower than that of the first coatings, which are arranged alternately on a transparent substrate, whereby the first coatings comprise mainly titanium oxide, which contains at least one additive, selected from the group comprising aluminum and/or aluminum oxide, whereby the proportion of Al atoms, in relation to the total number of metal atoms in the coating is in the range of 2 to 40%.

The transparent interference coatings according to the invention accordingly have a transparent coating according to the invention and at least one further coating with a low refractive index. By analogy to that stated above, transparent coatings according to the invention are also preferred in which the first coatings comprise titanium oxide and aluminum oxide and the proportion of Al atoms, in relation to the total number of metal atoms in the coating, is in the range 2 to 40%, in particular 5 to 35%, preferably 10 to 30%, and more preferably 15 to 20%. Further preferred features of the transparent interference coatings according to the invention can be inferred from the above disclosure of preferred transparent coatings, so that any redundancy is dispensed with here.

The coating with the high refractive index can contain as its glass-forming medium at least one compound selected from the group containing phosphorous compounds and boron compounds.

Silicon dioxide is preferably used as the low refractive index coating in the transparent interference coatings according to the invention.

The thickness of the high or low refractive index coating can vary within wide limits and can for example be between 500 nm and 3 μm. Typical coating thicknesses of individual coatings are between 20 and 500 nm, often between 10 and 200 nm.

A transparent interference coating system according to the invention can comprise a minimum of two coatings, but it can also be constructed from a repeated succession of coatings with high and low refractive index. There may be a series of up to a few hundred coatings here.

The thickness of the interference coating systems according to the invention can likewise vary within wide limits and can for example be between 500 nm and 3 μm. According to the invention, suitable coating thicknesses of interference coating systems are from 50 nm to 5 μm, preferably from 75 nm to 1.5 μm, and often from 100 nm to 1 μm.

According to the invention, particularly suitable coating thicknesses are 50 nm to 20 μm, preferably 75 nm to 8 μm, and often at 100 nm to 4 μm, frequently also 300 nm to 3 μm.

These and other aspects of the invention are apparent from and will be elucidated with reference to the embodiment described hereinafter.

In the drawing:

FIG. 1 shows a cutaway side view of a transparent interference coating according to the invention.

As FIG. 1 shows, the transparent interference coating 3 comprises coatings 1 with a high refractive index, the main component of which is titanium oxide (TiO$_2$) and coatings 2 with a low refractive index, the main component of which is silicon oxide (SiO$_2$). A first coating 1 with high refractive index is formed on the external surface of a transparent substrate 4; a coating 2 with a low refractive index is then formed on this coating. Further coatings 1, 2 with high and low refractive indexes are then formed alternately, so that a superposed arrangement with the desired number of coatings 1, 2 is created.

The transparent interference coating according to the invention can be formed on both the internal and the external surface or both surfaces of a lamp bulb, in order to reflect infrared rays and to allow through rays in the visible range of the transparent spectrum.

A further object of the present invention is a lamp which comprises a transparent interference coating according to the invention. Such a lamp according to the invention comprises a transparent bulb, a filament arranged within the bulb for light generation, and a transparent interference coating according to the invention to reflect infrared rays and to allow through rays in the visible light range, which is provided on the internal and/or external side of the bulb.

Such lamps according to the invention can, for example, be designed as halogen lamps, or as bowl reflector lamps or as high-performance lamps, for example high intensity discharge (HID) lamps and in particular ultra high-performance (UHP) lamps.

The coating according to the invention in titanium oxide with at least one additive from the group comprising aluminum and/or aluminum oxide can be created on the substrate in various ways.

Suitable methods for producing thin coatings can roughly be broken down into four classes: physical vapor deposition (PVD) methods, chemical vapor deposition (CVD), electroplating and spray methods. Spray methods can be suited to thick coatings since they have very high growth rates. CVD and electroplating are as a rule not well-suited to the creation of oxidic coatings. Plasma impulse chemical vapor deposition (PICVD) can also be suitable, however.

Chemical vapor deposition methods that can be used according to the invention are physical vapor deposition, reactive magnetron sputtering, ion sputtering, ion or plasma enhanced deposition, plasma impulse chemical vapor deposition and other sputter methods known to the person skilled in the art.

The PVD methods, in turn, can be broken down into three techniques: deposition techniques, sputter methods and laser ablation methods (PLD).

Of these, the sputter method is particularly well-suited to oxidic coatings and accordingly is preferred.

The term sputtering denotes cathode pulverization with ions or in the wider sense also sputter deposition of the pulverized material onto a substrate.

In the simplest embodiment of the sputter method, a diode arrangement is located inside a container with a positively charged anode and a negatively charged cathode. The container is evacuated until there is just a residual gas with a pressure of a few mbar. The residual gas used is preferably an inert gas (usually argon), in order to prevent reactions with the target or the substrate. Between the anode and the cathode a voltage is applied of between 150 and 3,000 V. Electrons are accelerated towards the anode, collide with argon atoms encountered on the way and ionize these. The ionized positively charged argon atoms are then accelerated towards the cathode and eject atoms from the cathodes or the target lying on top of this. Apart from neutral atoms of the target, secondary electrons are also released which ionize further argon atoms. Thus under suitable conditions, a stationary plasma results between the two electrodes. The neutral atoms ejected from the target are distributed evenly throughout the chamber and generate a thin coating on the substrate.

The kinetic energy of the neutral target atoms and the ionized sputter gas atoms is between 1 and 300 eV. Compared with the kinetic energy of the atoms in evaporation techniques of around 0.1 eV this is very high. In particular, this high kinetic energy of the ions accelerated in the field contributes to more compact and smoother coatings than with evaporation methods.

This general sputter method has already been refined in many aspects. Instead of a simple diode arrangement triodes or RF diodes can also be used for the plasma generation. With magnetron sputtering, the application of a magnetic field increases the ionization probability and sputter rate.

With the DC magnetron sputter method, apart from the diode voltage of approximately 1 kV a magnetic field is also applied. The magnetic field is generated by a ring magnet around the edge of the target and a central magnet in the middle and has a strength of a few hundredths Tesla on the target surface.

The magnetic field holds the secondary electrons generated in the vicinity of the target. This increases the probability of electron-atom ionization collisions and thus also the plasma density in the vicinity of the target. This provides two major advantages over the conventional sputter method: firstly, the sputter rate increases and secondly the plasma requires a lower pressure to burn. Higher sputter rates are important for industrial production in order to guarantee a shorter production time. A lower pressure for sputtering can, however, also be an advantage for thin coatings. Because of the lower pressure, fewer foreign gas atoms are present and the sputtered coatings are therefore more pure.

The oxygen partial pressure is set at p<100 mPa. Oxygen particle pressures that are suitable according to the invention can be between 5 and 25 mPa with a particular preference for <20 mPa. Further oxygen partial pressures that are suitable according to the invention are between 3 and 40 mPa, and 4 and 20 mPa, with a particular preference for between 8 and 14 mPa.

A further object of the present invention is a method for manufacturing a transparent coating of titanium oxide with at least one additive from the group comprising aluminum and/or aluminum oxide using the sputter technique, in which a target in titanium and/or titanium oxide is simultaneously used with a target comprising aluminum and/or aluminum oxide. Alternatively, coating can also take place from an alloy target comprising titanium and aluminum or a ceramic composite target comprising titanium oxide and aluminum oxide.

The method according to the invention is preferably carried out with argon as the residual gas, whereby preferred methods are carried out in the so-called oxide mode, i.e. in the presence of oxygen. Here, preferred methods are characterized in that the method is carried out at an oxygen partial pressure of between 5 and 20 mPa, preferably between 7 and 15 mPa and in particular between 10 and 12 mPa.

A particular advantage of the method according to the invention is that a low working temperature can be selected. Thus, preferred methods according to the invention are characterized in that the method is carried out at a substrate temperature of between 20 and 300° C., preferably between 50 and 280° C., in particular between 80 and 250° C., and most preferably between 100 and 200° C.

The coating(s) or coating properties according to the invention and temperature stability can also be obtained, for example, without heating. A particularly preferred temperature range is therefore also 50-150° C.

In a method according to the invention of working, even at low temperatures, a mixed oxide results whose refractive index corresponds to a mixture of aluminum oxide and titanium dioxide in the rutile modification in the corresponding ratio. Subsequent tempering to increase the refractive index is unnecessary, so that on the one hand the disadvantages of the thermal loading of the coating and of the substrate are avoided and on the other the coating of temperature-sensitive substrates is possible. The method according to the invention provides a coating in which the $TiO_2$ component is in an amorphous and high refractive index form and the crystallization power of which under the effect of temperature is extremely limited. The $TiO_2$ component does not form any anatase during further tempering, so that the anatase→rutile phase transition does not take place either. This results in increased mechanical and thermal stability of the coatings according to the invention. The temperature stability and transparency of the coatings are increased notably at up to approximately 950° C., compared to around 800° C. for undoped $TiO_2$.

The method according to the invention also provides very smooth coatings that are distinguished by high transparent quality. The refractive index of the coatings according to the invention is, depending on the Al content, at between $n=2.2$ and $n=2.65$, $\lambda=550$ nm.

Preferred method variants according to the invention use the magnetron sputter technique, with double magnetron sputter methods, in turn, being preferred. The field strength of preferred magnetron or double-magnetron sputter methods is between 10 and approximately 200 mT.

Irrespective of whether the magnetron or double-magnetron method is used, pulsed method variants are preferred. Here, for example, methods according to the invention are preferred in which the method is carried out at a pulse frequency of between 10 and 100 kHz, preferably between 10 and 70 kHz and in particular between 30 and 50 kHz.

In order to achieve a coating with a preferred, pure, rutile phase the sputter density is between 9 and 15 W/cm² with a particular preference for between 11 and 12 W/cm². The sputter density can be between 1 W/cm² and 40 W/cm².

The sputter density is defined as the induced process power normalized to the target area used.

A further possibility for varying the thickness of the coatings according to the invention to be applied is to adjust the power that is applied to the respective Ti or Al target. Here, methods according to the invention are preferred in which the total power applied to the target of $P = P_{Titan\text{-}Target} + P_{Aluminum\text{-}Target}$ is between 2,000 and 10,000 W, preferably between 3,000 and 6,000 W and in particular between 3,500 and 5,000 W.

Sputtering of mixed oxide coatings is possible according to the invention, for example from 2 different metallic targets or from one or more metallic alloy targets and from ceramic oxide targets.

Working is generally in an oxygen/argon atmosphere.

The invention is elucidated by the following, non-limiting, embodiment.

EXAMPLE

Transparent coatings according to the invention of titanium oxide and aluminum oxide were produced using a bipolar pulsed double magnetron sputter method on quartz glass substrates of 50×50 nm in size.

For this, two metallic magnetron targets made from titanium or aluminum and arranged edgewise at 20° to one another were simultaneously eroded at a pulse frequency of 40 kHz in oxide mode, at an oxygen partial pressure of 11 mPa. The period per target was 25 μs. The horizontal component of the magnetic field applied to the magnetron at the site of the substrate was approximately 30 mT.

The ratio of ingredients of titanium and aluminum varied over the separately adjustable powers, that were applied to both targets, with the total power P ($P = P_{Titanium\text{-}Target} + P_{Aluminum\text{-}Target}$) always being 4 kW.

With this method according to the invention, transparent oxidic coatings with a coating thickness of 400 nm were obtained. The ratio of Al/(Al+Ti) was 0.13, and the refractive index at $\lambda=550$ nm was $n=2.55$.

General information on the measurement conditions:
T=23° C. (ambient temperature)
Atmospheric pressure=laboratory air (normal pressure)

Tempering Process

Tempering in laboratory air under normal pressure. Tempering time: 15 hours in each case.

X-ray Diffractometry

In order to be able to make statements about the phase compositions and the grain sizes, X-ray diffractometry measurements were performed on a Siemens D5000 diffractometer. Here, in the (θ-2θ)-method, a Bragg-Brentano-geometry without monochromator was used. An Ni filter suppressed the incident Cu-Kβ-line.

A Cu—Kα-tube was used as the radiation source. Typical measurement parameters were: Step by step: 2θ=0.02°, integration time: Δt=1 s. The accelerating voltage used was 40 kV for a beam current of 30 mA.

To determine the phase assignment a package developed by Siemens and incorporated into the measurement software was used.

Haze

The quantification of the dispersion level of the samples was based on the determination of a parameter which is referred to as "Haze". With this measurement method, a spectral photometer is used which determines the diffusely dispersed components of the electromagnetic radiation transmitted and normalizes it to the total transmitted current ($T_{total} = T_{spec} + T_{diffus}$). The haze in the transmission is therefore defined in a range of values between zero and one as $$\text{Haze}(\lambda) = \frac{T_{diffus}(\lambda)}{T_{total}(\lambda)} = \frac{T_{diffus}(\lambda)}{T_{diffus}(\lambda) + T_{spec}(\lambda)} \quad (1)$$

It should be noted that the measuring curves generally contain current modulations because of interference effects, which due to the normalization cannot be fully compensated. Thanks to the measurement over a wide spectral range however their effect is suppressed to a large extent.

With suitable mathematical methods, the respective dispersion level of the sample can be quantified from the spectral measurement data. In the present exercise, to this end and in accordance with equation (2), the area below the curve in the visible spectral range ($\lambda=380 \ldots 800$ nm) was integrated ("iHaze"), so that the current modulations even out. Since the coating thicknesses of all samples were set at around 400±10 nm, a consideration of any density effect of the dispersion could be dispensed with. The dispersion contribution of the glass substrate due to any non-uniformities or incomplete surface cleaning can also be ignored in this assessment since it is within the order of magnitude of the measuring accuracy. As a result of the spectral integration of the dimensionless "Haze" variable, the resultant "iHaze" variable takes on the dimension [length in nm].

$$iHaze = \int_{380\,nm}^{800\,nm} \text{Haze}(\lambda) d\lambda \quad (2)$$

Measuring instruments: The measurements were carried out with nonpolarized light on a Cary 5E spectral photometer from Varian in a spectral range of 350 to 800 nm. In order to gauge the diffusely transmitted components $T_{diffus}(\lambda)$, an integrating sphere was provided (measuring spot size: 10×10 nm).

Here the directed and non-diffused components of the electromagnetic radiation transmitted for a vertical radiation incidence are derived from the measuring sphere and concentrated into a beam dump. The diffused signal component $T_{diffus}(\lambda)$ is captured in a sphere (diameter 110 nm) coated with PTFE (polytetrafluoroethylene) and measured via a photodioide that is protected from direct irradiation. The higher this is, the stronger the sample diffuses the light. Because of the multiple reflections of the light on the inner surface of the sphere at each point of the sphere volume the same wavelength-dependent radiation intensity is present. Because of the glare, here the detector does not measure any direct signal from the sample or from the indirectly illuminated sphere surface (in the case of closed beam dump). If the beam dump is covered by a barium sulfate plate, apart from the diffused the specular component $T_{spec}(\lambda)$ is also contained in the measurement signal. The Haze is calculated according to equation 1.

Ellipsometry

To determine the refractive index and the coating thickness of the samples, the ellipsometry method of measurement was used. The method is based on the change in polarization state of a wave when reflected onto a sample surface under investigation. The change in polarization state is described by the quotients p of the two complex Fresnel reflection coefficients $r_p$ and $r_s$. This can be illustrated by the equation $$\rho = \frac{r_p}{r_s} = \tan\Psi \cdot e^{i\Delta} \quad (3)$$

which is also known as the ellipsometric basic equation. Here, $\Psi$ represents the change in the amplitude ratio of the vertical and parallel components and $\Delta$ measures the change in the phase difference between the two partial waves as a result of the reflection. The subscripts s and p symbolize the part waves polarized vertically and parallel to the incidence level. The determination of the refractive index was carried out according to R. M. A. Azzam, N. M. Bashara, Ellipsometry and polarized light, North Holland, Amsterdam (1987).

If a suitable material model is now defined for the coating/substrate system, in which its properties (transparent constants, coating thickness) are combined with the complex reflection coefficients and the measurement parameters (wavelength, angle of incidence), then the change in polarization state allows accurate statements to be made on a series of important film parameters. The dispersion of the transparent constants of the samples was described using a standard parameterized Lorentz oscillator model. This defines the oscillatory behavior of the electrons, which have a flexible bond with the solid atoms, when excited with electromagnetic radiation (see: A. Röseler, Infrared Spectroscopic Ellipsometry, Akademie-Verlag, Berlin (1990)). The refractive indexes n or $n_{550}$ that are given relate to a wavelength of $\lambda$=550 nm and are accurate to within ±0.01.

For the ellipsometric measurements, a spectrophotometric ex-situ ellipsometer SE800 from SENTECH Instruments was available, which works in the so-called polarizer compensator sample step scan analyzer (PCSSA) configuration.

The evaluation was carried out in the spectral range from 380 to 850 nm and with angles of incidence varying between 55 and 75°($\Delta$=5°). In order to fit the measurement data to the model, a commercial evaluation package from SENTECH Instruments called AdvancedFit was available which incorporates a numeric method according to the simplex algorithm.

REFERENCE LIST 1. transparent coating (first coating)
2. second coating with a refractive index that is lower than that of the first coating
3. transparent interference coating
4. permeable substrate

We claim

1. A transparent, temperature-stable coating comprising:
   an amorphous titanium oxide with at least one additive from a group consisting of aluminum and aluminum oxide wherein the coating includes a rutile-like short-range order structure,
   characterized in that a proportion of Al atoms in the coating in relation to a total number of metal atoms in the coating (1) is in the range of 2 to 40%.

2. The transparent coating as claimed in claim 1, characterized in that the coating is based on titanium oxide and aluminum oxide, in which the proportion of Al atoms in relation to the total number of metal atoms in the coating (1) is in the range of 2 to 40%.

3. The transparent coating as claimed in claim 1, characterized in that, at $\lambda$=550 nm, a refractive index of the coating is n=2.30 to n=2.68.

4. The transparent coating as claimed in claim 1, characterized in that the coating, following a thermal treatment in an oven at 950° C. for 15 hours, remains transparent, and/or at a wavelength of $\lambda$=550 nm has a refractive index of n=2.30 to n=2.68.

5. The transparent coating as claimed in claim 1, characterized in that the coating with a coating thickness of 400 nm following a thermal treatment in an oven at 900° C. and for 15 hours remains transparent and/or has an iHaze value of $\geq$0 nm to 80 nm.

6. The transparent coating as claimed in claim 1, characterized in that the titanium oxide excludes an anatase structure.

7. A transparent interference coating for reflection of light within a wavelength range of the transparent spectrum of 250 to 5,000 nm, wherein the coating (3) has a first coating or coatings (1) and a second coating or coatings (2) with a refractive index that is lower than that of the first coating(s) (1), which are arranged on a substrate (4), characterized in that the first coating(s) (1) is (are) formed as claimed in claim 1.

8. The transparent interference coating as claimed in claim 7, characterized in that the refractive index is n=1.32 to n=2.0 for the second coating(s) (2) at a wavelength of $\lambda$=550 nm.

9. A lamp with a transparent coating and/or transparent interference coating as claimed in claim 1, characterized in that the transparent coating and/or the transparent interference coating is provided on and/or in the internal and/or external side of the bulb.

* * * * *